United States Patent
Blichasz et al.

(10) Patent No.: US 6,945,820 B1
(45) Date of Patent: Sep. 20, 2005

(54) ELECTRICAL CONNECT HAVING INTEGRATED OVER CURRENT PROTECTOR

(75) Inventors: Charles S. Blichasz, York, PA (US); Leonard Espenshade, Harrisburg, PA (US); James H. Hyland, Harrisburg, PA (US); Kevin E. Walker, Hershey, PA (US); Michael Yeomans, Camp Hill, PA (US)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/988,651

(22) Filed: Nov. 15, 2004

(51) Int. Cl.[7] ............................................. H01R 13/66

(52) U.S. Cl. ..................................... 439/620; 439/676

(58) Field of Search ............................... 439/620, 676, 439/607, 540.1

(56) References Cited

U.S. PATENT DOCUMENTS

| | | | |
|---|---|---|---|
| 6,344,969 B1 * | 2/2002 | Lord et al. ................... | 439/620 |
| 6,511,348 B1 | 1/2003 | Wojtacki et al. | |
| 6,641,440 B1 * | 11/2003 | Hyland et al. .............. | 439/620 |
| 6,655,988 B1 | 12/2003 | Simmons et al. | |

* cited by examiner

Primary Examiner—Tho D. Ta
(74) Attorney, Agent, or Firm—Wei Te Chung (57) ABSTRACT

An electrical connector (100) includes an insulative housing (1) and an electrical subassembly disposed with in the insulative housing. The electrical subassembly includes a first and a second printed circuit boards (31, 32) each having a plurality of terminals (34, 35), a third printed circuit board (33) disposed above and spaced a distance from the first and second printed circuit board, a first and second magnetic modules (51, 52) electrically connected with the first, second and third printed circuit boards, and a pair of over current protectors (54) electrically attached to the first and second magnetic modules.

9 Claims, 12 Drawing Sheets

ELECTRICAL CONNECT HAVING INTEGRATED OVER CURRENT PROTECTOR

BACKGROUND OF THE INVENTION

1. Field of the Invention

The present invention relates to an electrical connector, and more particularly to a modular jack having integrated over current protection for ensuring high signal transmission performance.

2. Description of the Prior Art

Almost all appliances require both data connectivity and a power supply. Network devices typically communicate via wired data lines and receive power from a separate line. For example, personal computers (PCs) may communicate Ethernet signals via category five (CAT-5) Ethernet cable and power can be transmitted through the Ethernet port to an external device. On the other hand, a standard CAT-5 Ethernet cable has four twisted pairs, but only two of these are used for 10Base-T and 100Base-T. Therefore, providing power to an end device using the unused twisted pairs Ethernet cable is desirable in many situations. Power over Ethernet (PoE) technology is a revolutionary technology that allows different types of devices, to receive power as well as data over the single standard CAT-5 Ethernet cable, without needing to modify the existing Ethernet infrastructure. Generally, a modular jack, especially stacked RJ45 type modular jack with integrated magnetic components is employed as Ethernet jacks for networking applications.

A design is shown in U.S. Pat. No. 6,641,440 to Hyland et al., which discloses an electrical connector with power module. The electrical connector includes an electrical subassembly having a first and a second contact array assemblies, a third printed circuit board (PCB) assembly containing signal conditioning components, an internal PCB, a first and a second magnetic modules and a power module. The first and second magnetic modules are electrically connected with the first and second contact array assemblies, the internal PCB and the third PCB assembly via a plurality of pins embedded into the first and second magnetic modules. The power module is electrically connected with the first and second contact array assemblies, the internal PCB and the third PCB assembly via a plurality of conductors embedded into the power module. However, the powered module must continue to draw a minimum current. Therefore, there is a need to provide integrated over current protectors for the power module.

Hence, any improvement on avoiding the limitations disclosed above is welcomed.

BRIEF SUMMARY OF THE INVENTION

Accordingly, one object of the present invention is to provide an improved electrical connector having an over current protector for power magnetic components as well as having an easily assembled over current protector.

Another object of the present invention is to provide an electrical connector having integrated transient voltage suppression separated from signal areas.

Yet another object of the present invention is to provide an electrical connector with little modification to existing housing and shielding configuration to accommodate added power magnetic components and over current protector.

To fulfill the above-mentioned objects, according to a preferred embodiment of the present invention, an electrical connector includes an insulative housing and an electrical subassembly disposed with in the housing. The housing has a front face defining a plurality of plug-receiving cavities therethrough wherein the plug-receiving cavities are profiled one above the other, and a rear face defining a plurality of open-ended cavities communicating with corresponding pairs of plug-receiving cavities. The electrical subassembly includes a first and a second printed circuit boards each having a plurality of terminals having mating portions respectively extending into the plug-receiving cavities from the open-ended cavities, a third printed circuit board disposed above and spaced a distance from the first and second printed circuit board, a first and second magnetic modules arranged in a mirror image manner to be electrically connected with the first, second and third printed circuit boards, and a pair of over current protectors electrically attached to the first and second magnetic modules.

Other objects, advantages and novel features of the invention will become more apparent from the following detailed description when taken in conjunction with the accompanying drawings.

DETAILED DESCRIPTION OF THE INVENTION

Reference will now be made to the drawing figures to describe the present invention in detail.

Figure 1:
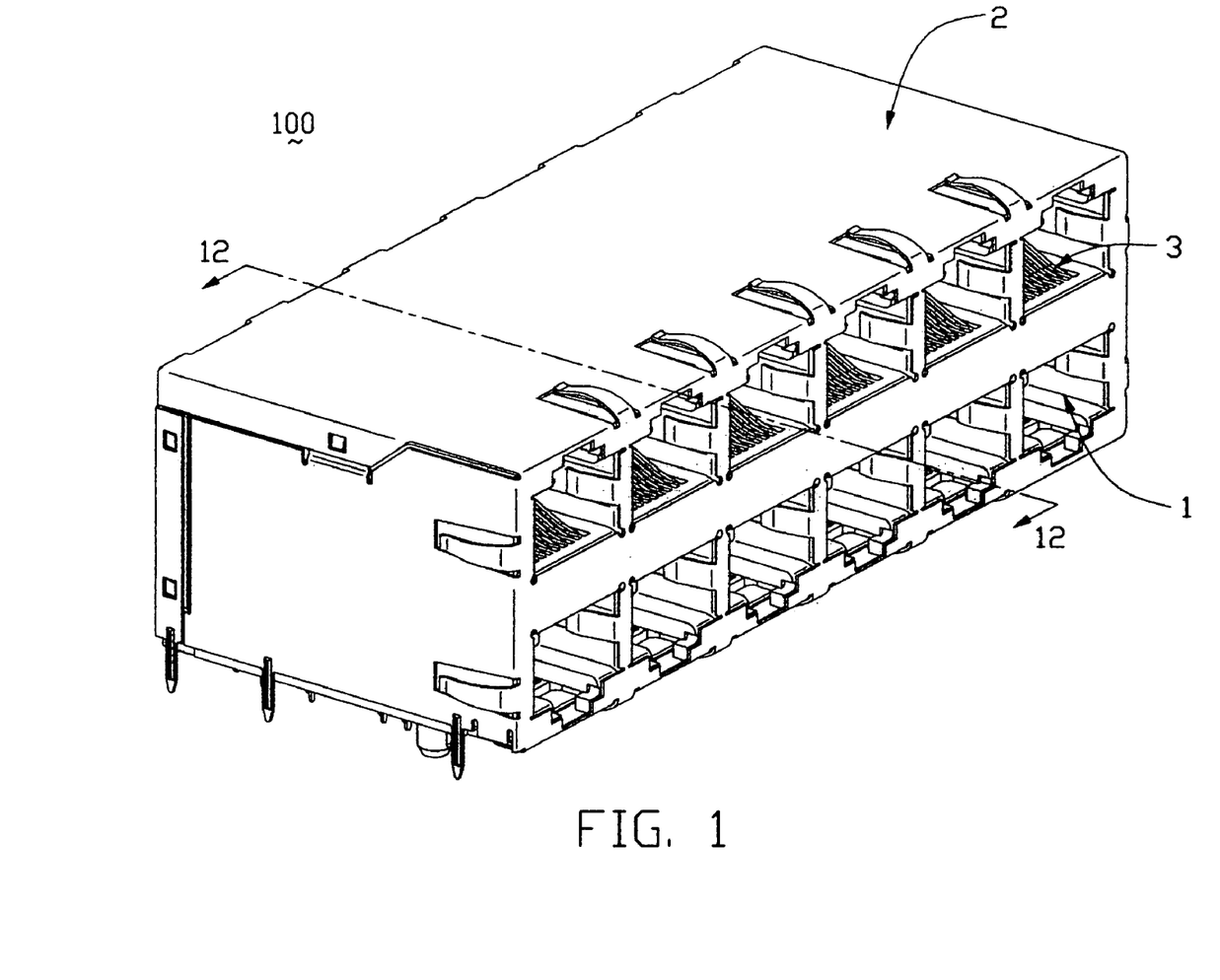
FIG. 1 is a perspective view of an electrical connector in accordance with the present invention.
Figure 2:
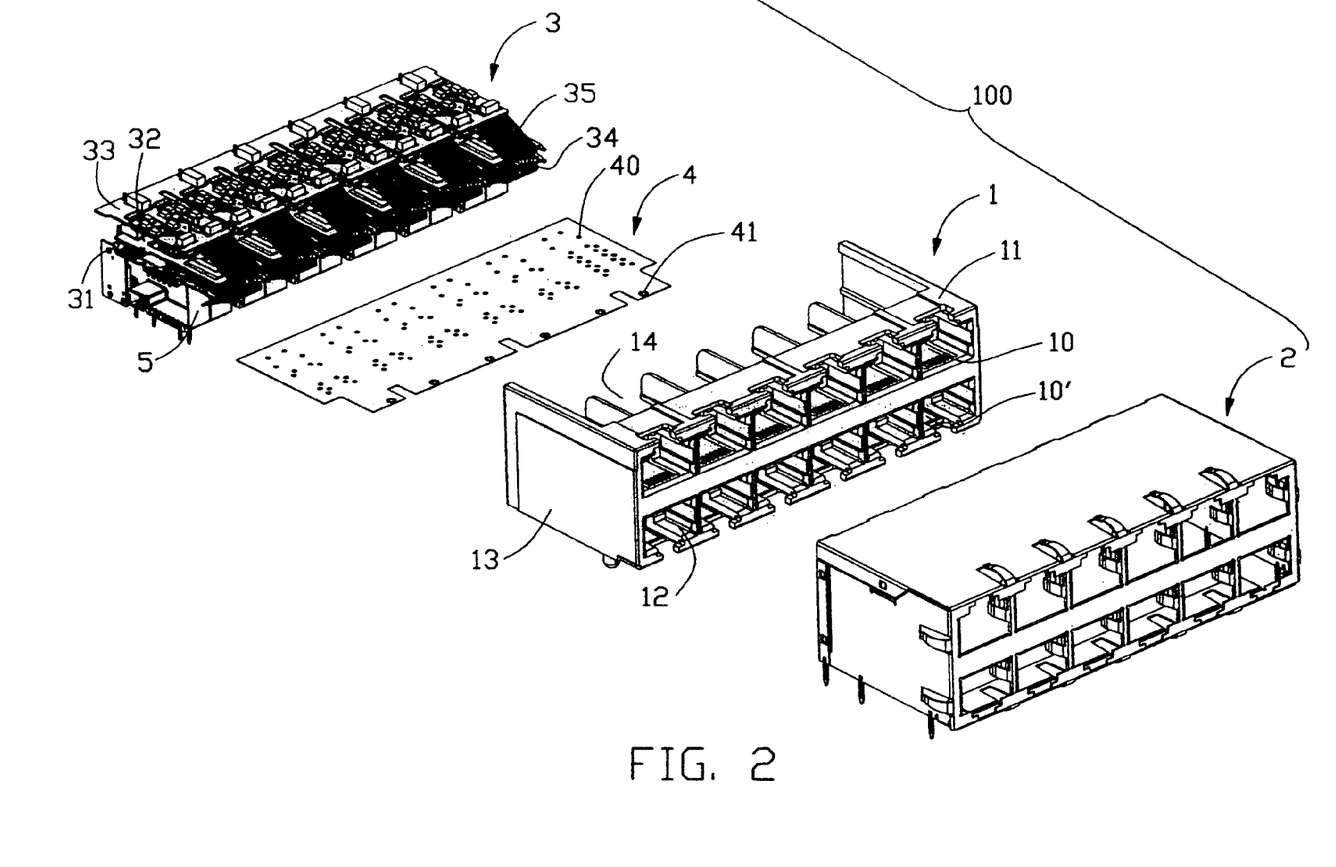
FIG. 2 is an exploded view of the electrical connector of FIG. 1.
Figure 3:
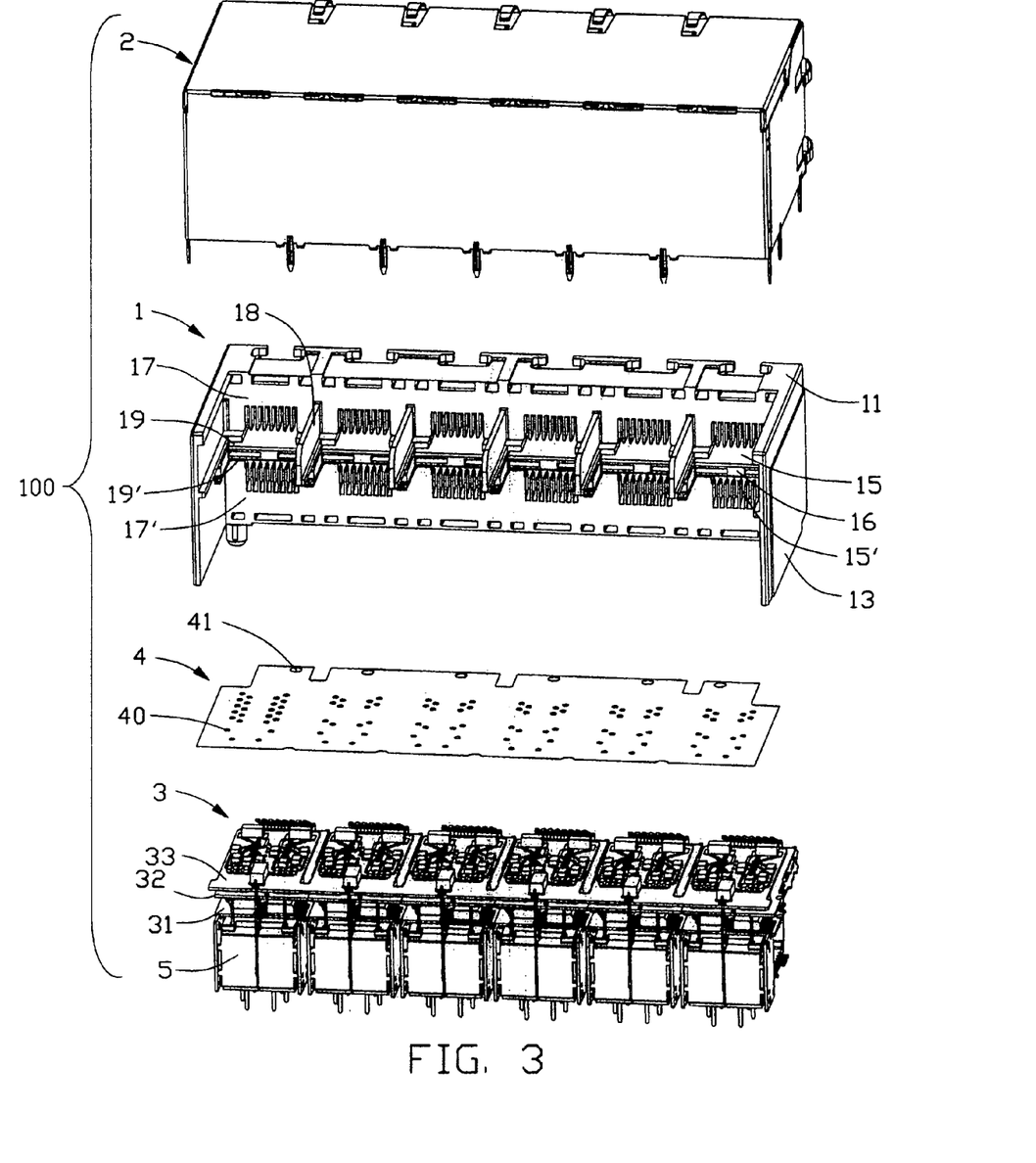
FIG. 3 is another exploded view of the electrical connector of FIG. 1.

Referring to the drawings in greater detail, and first to FIGS. 1–3, an electrical connector 100 of the present invention is mounted on a main printed circuit board (PCB, not shown) and preferably a multi-port RJ45 type modular jack for high speed signal transmission. The electrical connector 100 includes a rectangular insulative housing 1, a subassembly 3 disposed within the housing 1 and a metallic shield 2 for enclosing the housing 1. More, the electrical connector 100 includes a flexible circuit shield 4 (shown in FIGS. 2 and 3) extending along a longitudinal axis thereof. The bottom flexible circuit shield 4 defines a plurality of clear through holes 40 at predetermined locations and plated through holes 41 at front edge thereof, and has been formed to cover substantially all of bottom surface of the housing 2 for shielding the main PCB.

Figure 4:
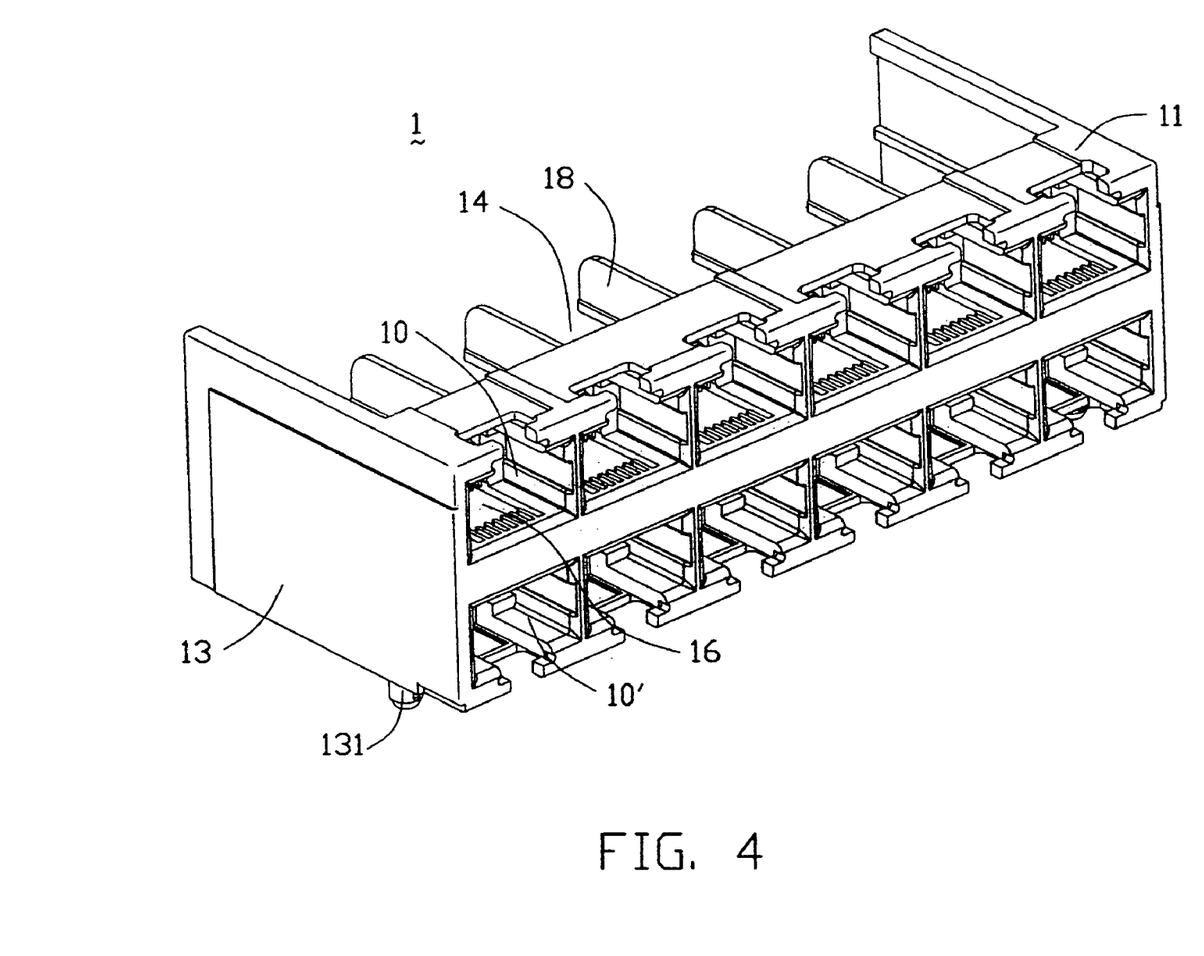
FIG. 4 is a perspective view of an insulative housing of the electrical connector as shown in FIG. 2.
Figure 5:
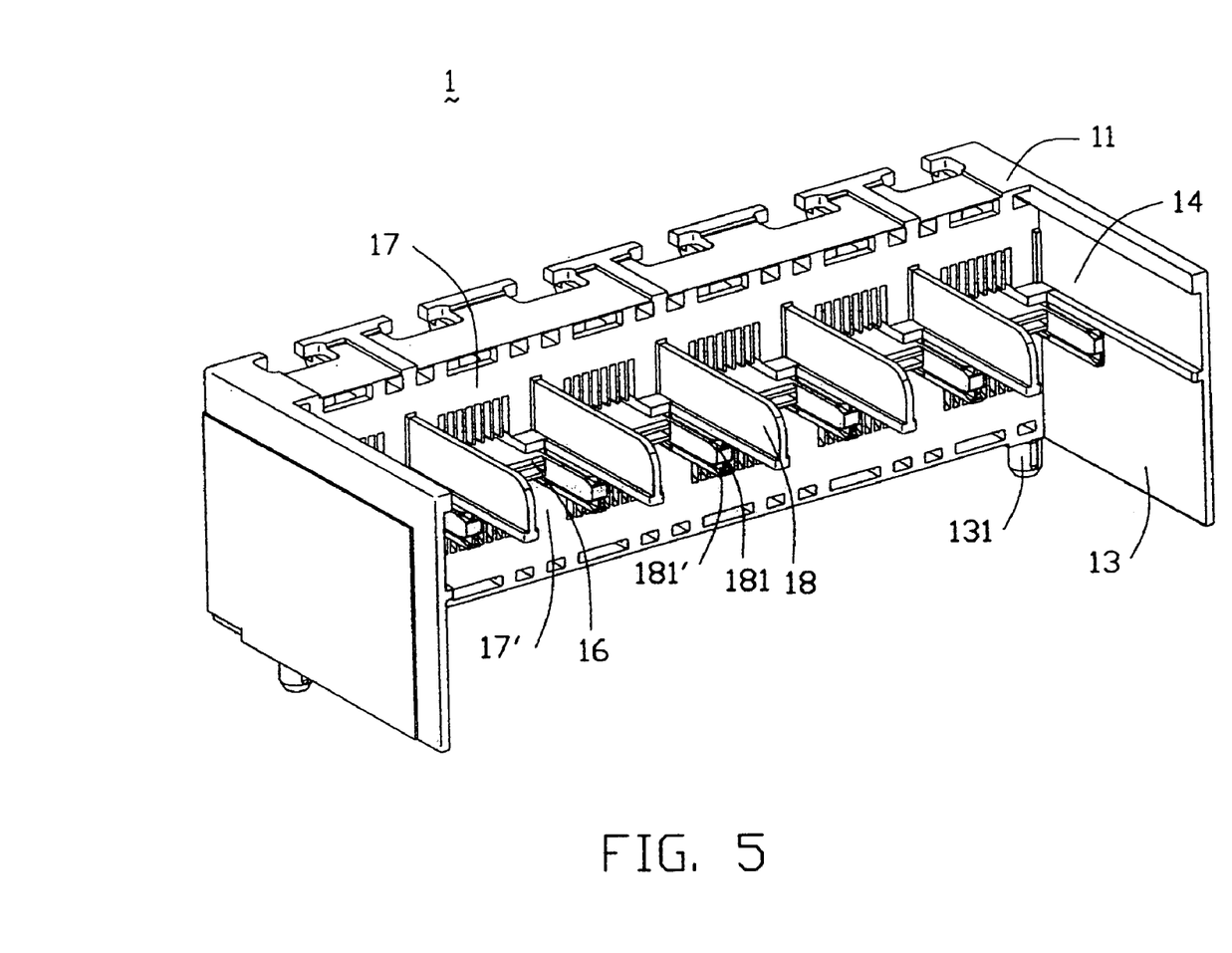
FIG. 5 is a perspective view of the housing, but taken from another viewpoint.
Figure 6:
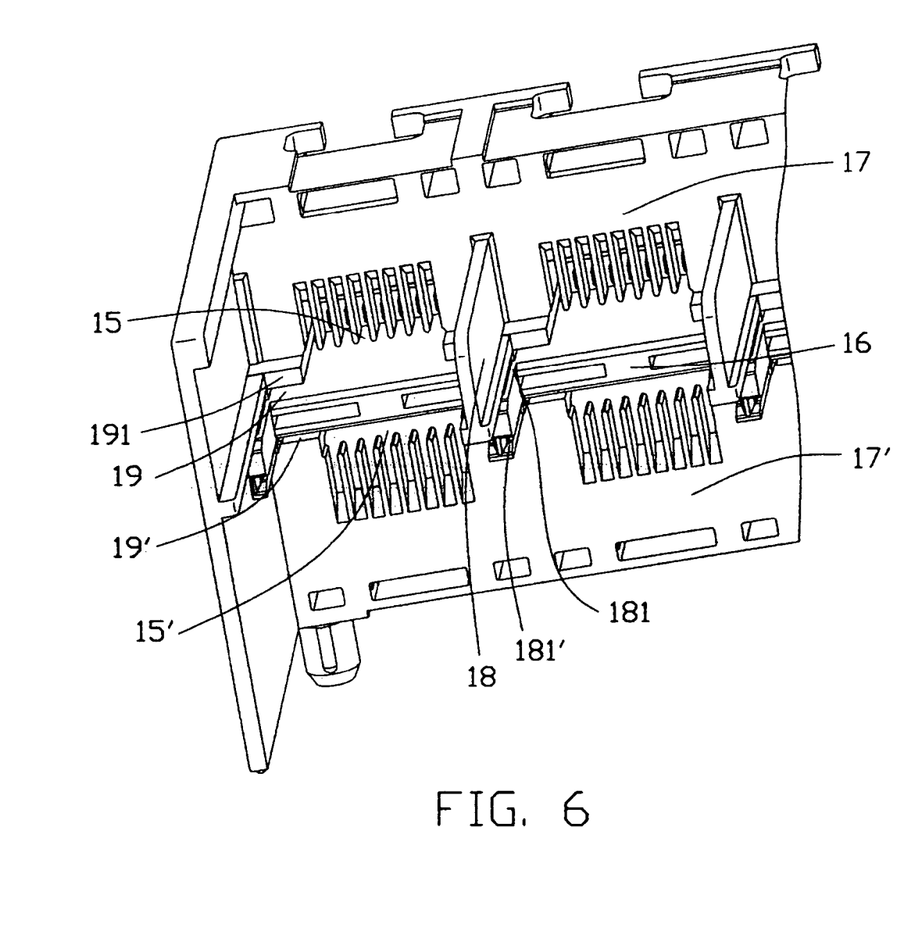
FIG. 6 is a partially enlarged perspective of the housing as shown in FIG. 5.

As shown in FIGS. 4–6, the housing 1 includes a top wall 11, a bottom wall 12 (FIG. 2) and opposite side walls 13 extending rearwardly beyond the top and bottom walls 11, 12. The housing 1 defines upper and lower plug-receiving cavities 10, 10' arranged in side-by-side fashion as two rows, one disposed atop another, in a front face which is configured for receiving modular plugs (not shown), and defines a plurality of open-ended cavities 14 in a rear face communicating with corresponding pairs of plug-receiving cavities 10, 10' through upper and lower channels 15, 15'. The plug-receiving cavities 10, 10' share an intermediate wall 16 formed therebetween. Each plug-receiving cavities 10 (10') and open-ended cavity 14 share a partition 17 (17') standing therebetween. The neighboring open-ended cavities 14 share a vertical plate 18 extending therebetween. Each vertical plate 18 defines upper and lower guiding passageways 181, 181' extending in a back-to-front direction of the housing 1 and extending into the plug-receiving cavities 10, 10' respectively. The housing 1 further defines a pair of upper and lower locating slots 19, 19' elongating beside each plug-receiving cavities 10 (10') and communicating with corresponding upper and lower guiding passageways 181, 181' of the vertical plate 18, especially, the upper and lower locating slots 19, 19' offsetting from each pair in a vertical direction of the housing 1. It is noted that no interference areas exist in the lower locating slots 19' to help lowering assembly forces. Furthermore, the housing 1 has a pair of mounting posts 131 symmetrically extending downwardly from bottom edges of opposite side walls 13 for securing the electrical connector 100 to the main PCB.

Referring to FIGS. 7–12, the subassembly 3 includes a plurality of magnetic box assemblies 5, a first and second contact array assemblies having first and second PCBs 31, 32 and first and second terminal arrays 34, 35 soldered thereon, and top PCB assembly having a third PCB 33. It is noted that the first, second and third PCBs 31, 32, 33 are one-piece structure to be cut into by a plurality of notches to form a plurality of PCB units corresponding to the magnetic box assemblies 5.

Figure 7:
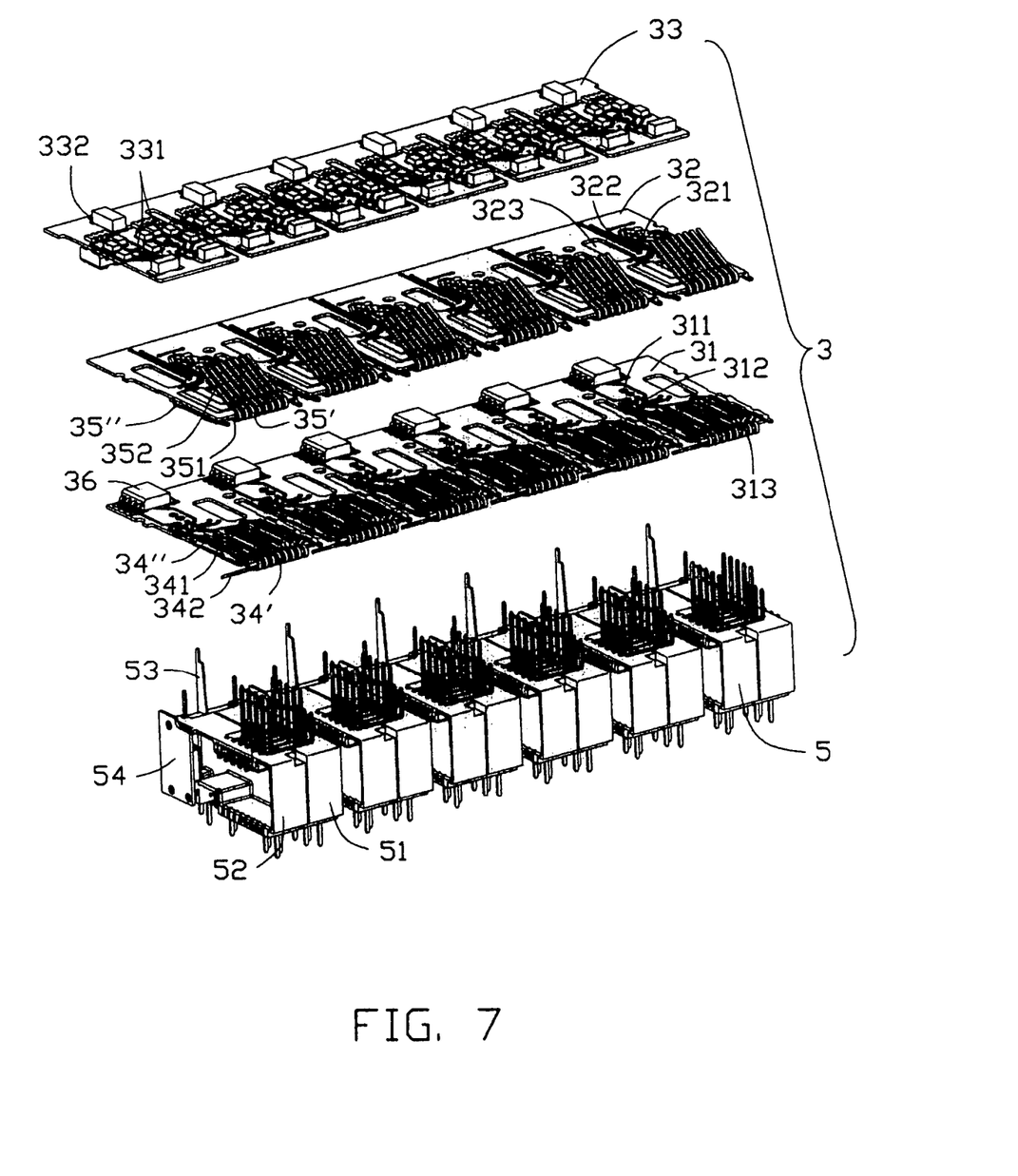
FIG. 7 is an exploded view of the electrical subassembly of the electrical connector, wherein the electrical subassembly includes a plurality of magnetic box assemblies, first and second terminal arrays, and a top printed circuit boards assembly.
Figure 8:
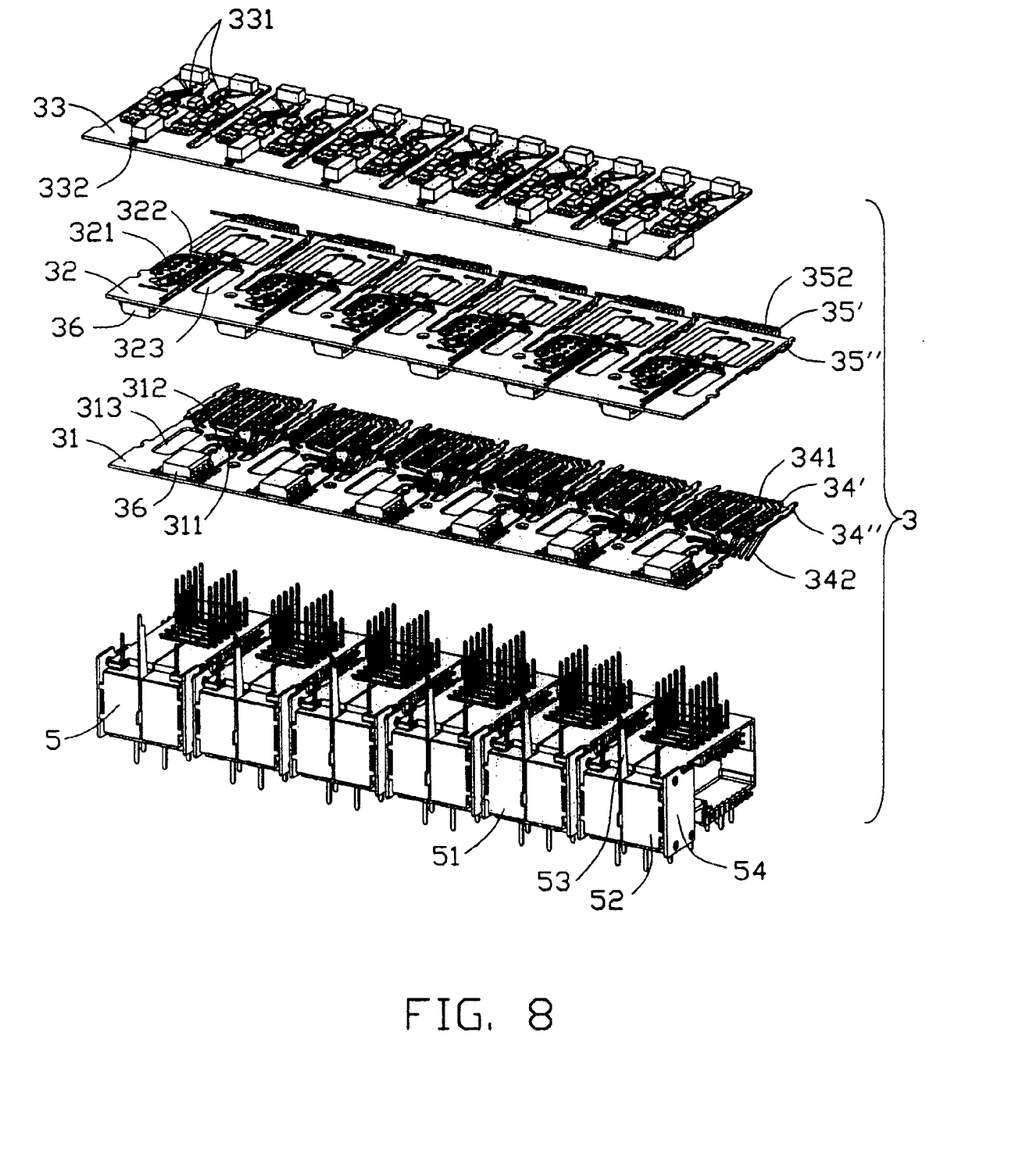
FIG. 8 is an exploded view of the electrical subassembly, but taken from another viewpoint.

The first and second contact array assemblies are similar in structure. Each of first and second terminal arrays 34, 35 includes first and second terminals 34'(35') and first and second side conductors 34"(35") respectively, and each first and second side conductor 34"(35") with serrations formed thereon. The first and second terminals 34', 35' each have first and second solder portions 341, 351 soldered to solder pads of the first and second PCBs 31, 32, and first and second contacting portions 342, 352 being angled obliquely and rearwardly located below and above respective lower and upper faces of the first and second PCBs 31, 32 on which conductive traces are formed. The solder pads to which the first and second terminals 34', 35' are soldered, and the conductive traces are so designed and arranged that they can affect cross-talk between the first and second terminals 34', 35'.

The first and second PCBs 31, 32 define first and second plated through holes 311, 321, first and second clean through holes 312, 322 and first and second rectangular clear apertures 313, 323 at respective first and second rear portions. It is noted that the term "plated" means that there is conductive material plated on walls defining the through holes, while the term "clear" means that there is no conductive material plated on walls defining the through holes. In addition, the first and second PCBs 31, 32 respectively have a transient voltage suppressor (TVS) located at a corner near the first and second plated and clear through holes 311, 321, 312, 322 used to protect the first and second high-speed terminals from transients.

The third PCB 33 of the top PCB assembly carries a plurality of signal conditioning components (not labeled) such as capacitors and resistors well-proportioned on opposite faces for signal conditioning and termination to be shared by the plug-receiving cavities 10, 10'. In addition, the third PCB 33 symmetrically defines third plated through holes 331 at front region thereof and a plated grounding through holes 332 at rear region thereof.

Figure 9:
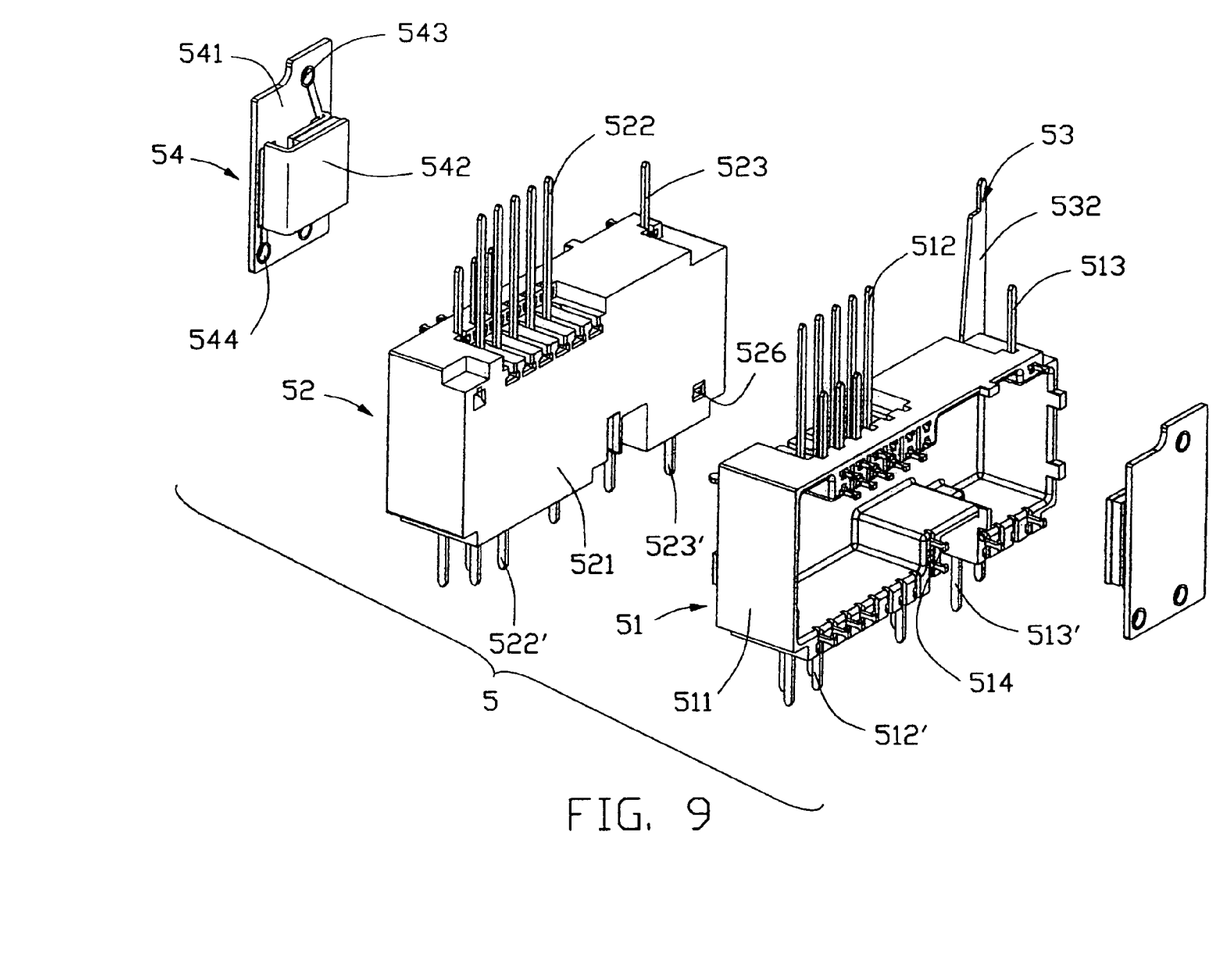
FIG. 9 is an exploded view of the magnetic box assembly, wherein a grounding plane engaging with a first magnetic module of the magnetic box assembly.
Figure 10:
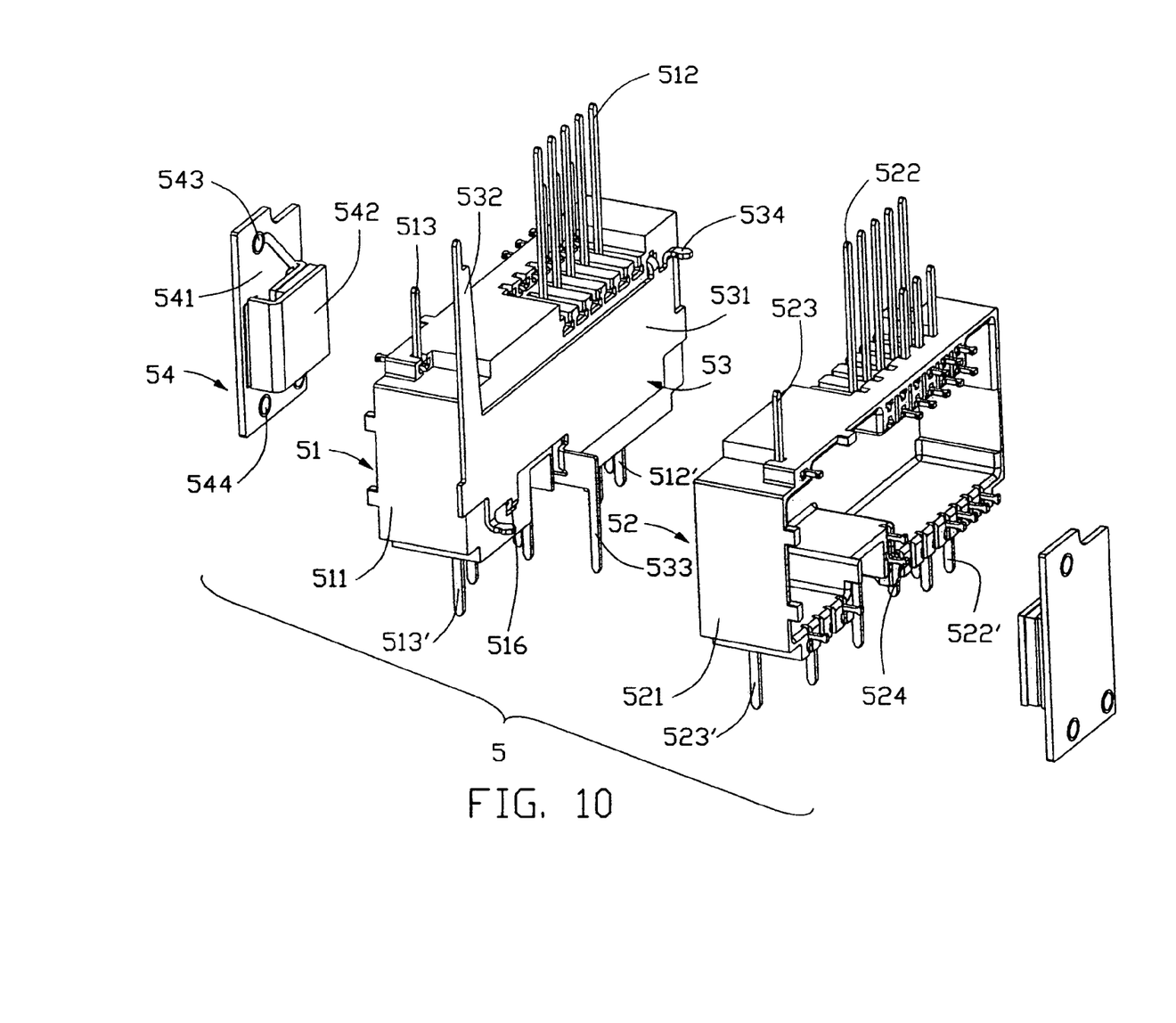
FIG. 10 is an exploded view of the magnetic box assembly similar to FIG. 9, but taken from another perspective.
Figure 11:
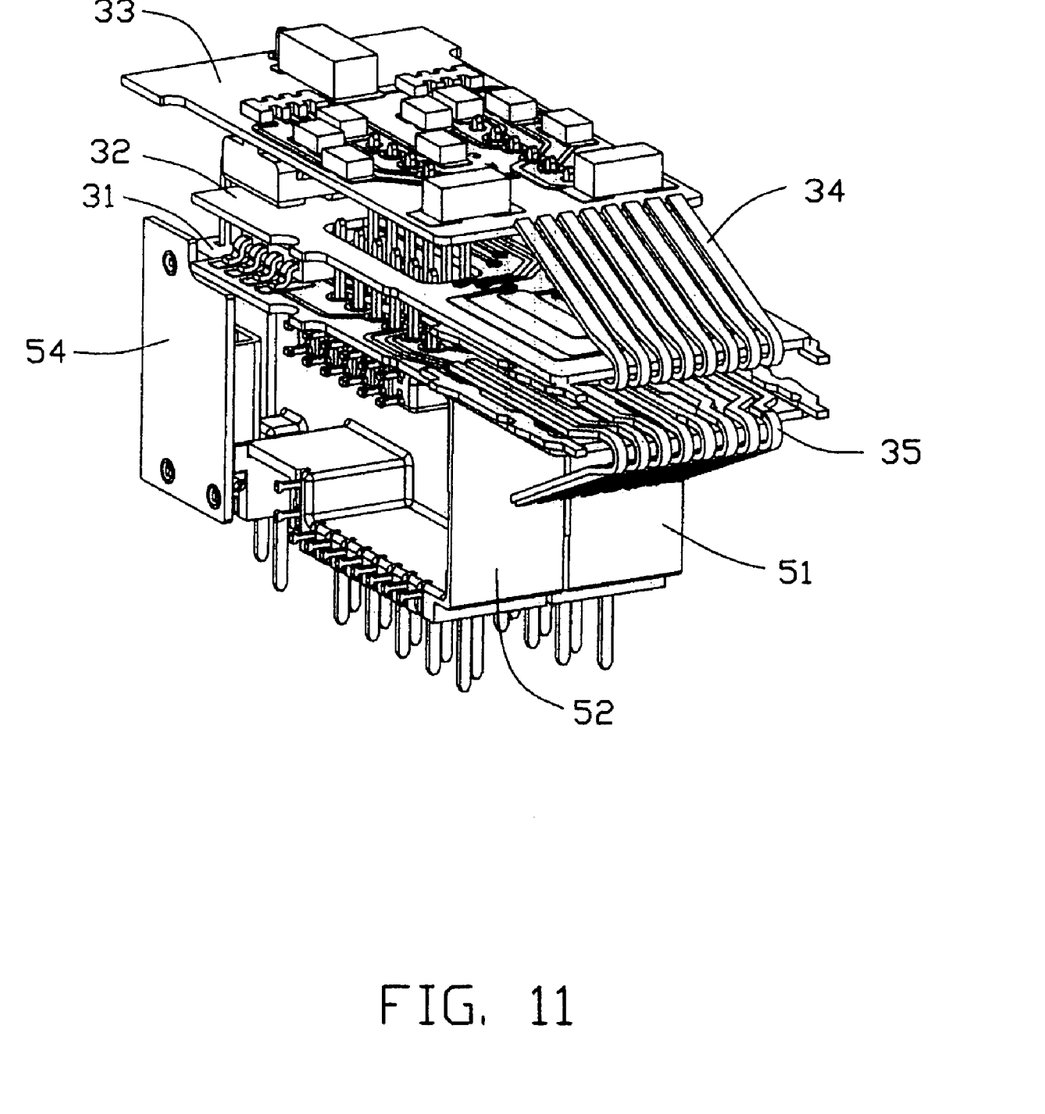
FIG. 11 is a partially perspective view of the electrical subassembly, wherein the part of the subassembly is to be assembled to a pair of ports of the electrical connector.
Figure 12:
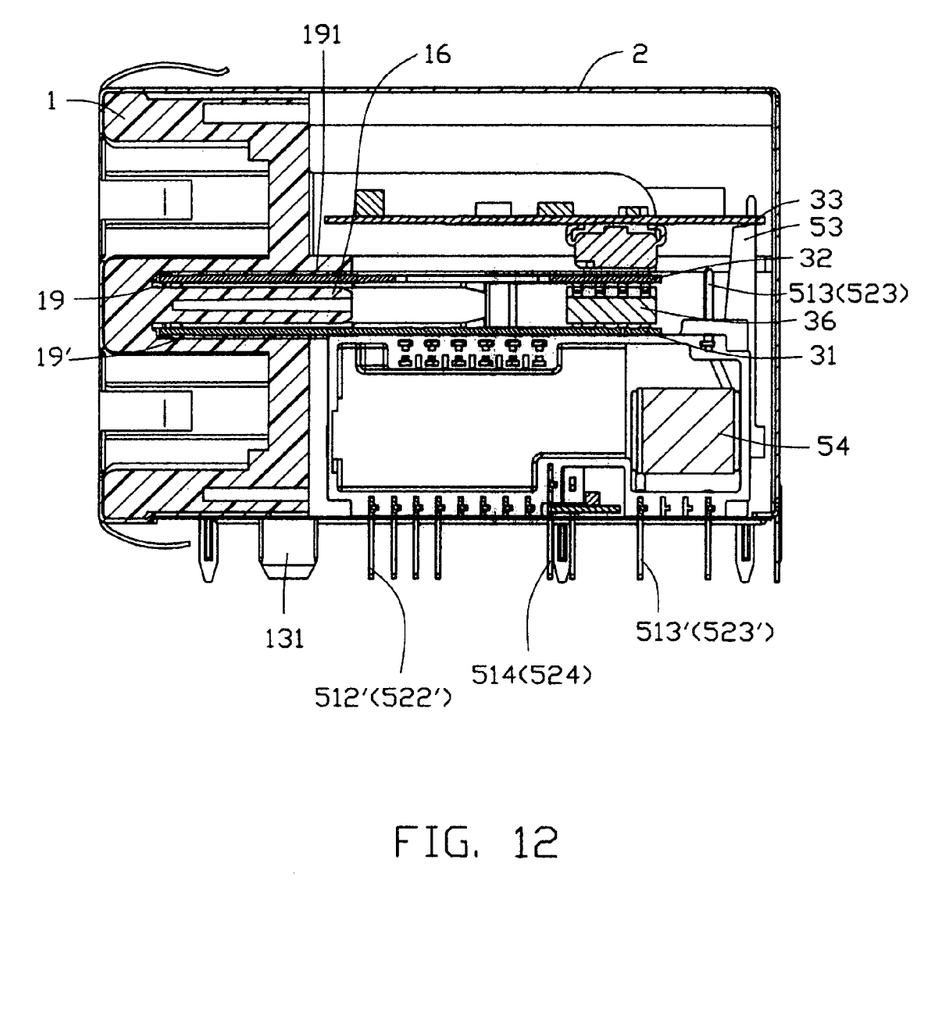
FIG. 12 is a cross-sectional view of the electrical connector taken along section line 12—12 of FIG. 1.

Referring to FIGS. 9 and 10 in conjunction with FIG. 11, each magnetic box assembly 5 includes first and second magnetic modules located back-to-back 51, 52, a grounding plane 53 disposed between the first and second magnetic modules 51, 52, and a pair of over current protectors 54 solder to the first and second magnetic modules 51, 52. The first and second magnetic modules 51, 52 are near identical in structure and include first and second hollow containers 511, 521, upper and lower L-shaped signal pins 512, 522, 512', 522' respectively embedded into upper and lower portions of front region of the container 511, 521, a plurality of magnetic coils (not shown) housed within corresponding front region of the container 511, 521 and connecting with horizontal section of the upper and lower signal pins 512, 522, 512', 522', upper and lower L-shaped power pins 513, 513', 523, 523' respectively embedded into upper and lower portions of rear region of the container 511, 521, a plurality of power coils (not shown) housed within corresponding rear region of the container 511, 521 and connecting with horizontal section of the upper and lower signal pins 513, 513', 523, 523', and a dual post 514 embedded into the container 511, 521 between the lower signal pins 512, 522, 512', 522' and power pins 513, 513', 523, 523'. Furthermore, a pair of offsetting indentions 516, 526 are defined on side edges of vertical walls of the first and second container 511, 521.

As is clear shown in FIG. 10, the grounding plane 53 has a plane plate 531 and upper and lower grounding pins 532, 533 projecting upwardly and downwardly respectively from top and bottom edges of the plane plate 531, wherein the lower grounding pin 533 is bent right-angle to insert into the first container 511. The grounding plane 53 further forms two pairs of offsetting projections 534 respectively on side edges of the side walls thereof and each pair of projections 534 project respectively toward the indentations 516, 526 of corresponding first and second container 511, 521 for joining the first and second magnetic modules 51, 52 together.

As is illustrated in FIGS. 9 and 10, the over current protectors 54 respectively makes use of a vertical substrate 541 on which is provided with a plurality of circuit traces and a switch member 542 thereon. The vertical substrate 541 defines an upper plated through hole 543 and a pair of lower plated through holes 544, wherein the upper and lower plated through holes 543, 544 electrically interconnect with the switch member 542 via the circuit traces. The over current protector 54 of the present invention is in the form of a Polyswitch PCB assembly and the structure and function are well known to those skilled in the art. Generally, should any power control fail short, the PolySwitch PCB assembly shuts down the individual port and helps prevent a system-wide power failure. Once the fault condition and power are removed, the device resets allowing the affected equipment to return to normal operating conditions. It should be understood that although the PolySwitch PCB assembly is shown as a preferred embodiment of the present invention, the present invention is not limited to this specific embodiment. The concept of the present invention can also be applied to over current protectors of other types than the PolySwitch PCB assembly.

In assembly, the grounding plane 53 is sandwiched between the first and second containers 511, 521 of the magnetic box assembly 5 with the offsetting projections 534 respectively engaging with corresponding indentations 516, 526. The horizontal sections of the signal pins 512, 522, 512', 522' are coupled via corresponding magnetic coils. The horizontal sections of the power pins 513, 513', 523, 523' are coupled via corresponding power coils and meanwhile the horizontal sections of the power pins 513, 513', 523, 523' soldered with corresponding upper and lower plated through holes 543, 544 of the vertical substrate 541 of the over current protectors 54, whereby the first and second magnetic modules 51, 52, the grounding plane 53 and the over current protectors 54 are tightly assembled as the magnetic box assembly 5 as best shown in FIGS. 7 and 8.

Then the first, second contact array assemblies and top PCB assembly are closely stacked with a lower surface of the first contact array assembly closed to upper surfaces of the first and second magnetic modules 51, 52. Some of the upper signal pins 512 of the first magnetic module extend through the first plated through holes 311 of the first PCB 31 and the other further extend through the second clean holes 322 of the second PCB 32 to be finally soldered in corresponding third plated through holes 331 of the third PCB 33. Some of the upper signal pins 522 of the second magnetic module 52 extend through the first clean holes 312 of the first PCB 31 to be soldered to the second solder holes 321 of the second PCB 32 and the others further extend to be finally soldered in corresponding third plated through holes 331 of the third PCB 33. The upper grounding pin 532 extend upwardly to be soldered in the grounding plated hole 332 of the third PCB 33, whereby the first and second terminal array assemblies, the top PCB assembly and the magnetic box assembly 5 are tightly assembled as the subassemblies 3.

The subassembly 3 is inserted into the housing 1 from the rear open-ended cavities 14. The first and second terminal array assemblies move forwardly along with the upper and lower guiding passageways 181, 181' and the upper and lower locating slots 19, 19' until the front portions of the first and second terminal arrays 34, 35 completely entering into the plug-receiving openings 10, 10'. If desired, with the side edges of the first and second terminal array assemblies in the locating slots 19, 19', a pair of interference tabs 191 may interferencially engage with upper surface of the second PCB 32. When the subassembly 3 is loaded within its position, the flexible circuit shield 4 position under the subassembly 3 with the lower ends of the signal pins 512', 522', the power pins 513', 523 and the grounding pin 533 extending through the clean through holes 40 of the flexible circuit shield 4. Finally, the shield 2 encloses the housing 1 for surrounding and shielding the housing 1, whereby the subassemblies 3, the housing 1 and the shield 2 are tightly assembled as the electrical connector 100 as best shown in FIG. 1.

It is to be understood, however, that even though numerous, characteristics and advantages of the present invention have been set fourth in the foregoing description, together with details of the structure and function of the invention, the disclosed is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical connector mounted on a main printed circuit board, comprising:

an insulative housing having a front face defining a plurality of plug-receiving cavities therethrough wherein the plug-receiving cavities are profiled one above the other, and a rear face defining plurality of open-ended cavities communicating with corresponding pairs of plug-receiving cavities; and an electrical subassembly disposed within the insulative housing, comprising: first and second printed circuit boards each having a plurality of terminals attached thereon, the terminals having mating portions respectively extending into the plug-receiving cavities from the open-ended cavities;

a third printed circuit board disposed above and spaced a distance from the first and second printed circuit boards;

first and second magnetic modules electrically connecting with the first, second and third printed circuit boards; and a pair of over current protectors electrically attached to the first and second magnetic modules;

wherein the over current protector has a substrate on which is provided with circuit traces and a switch member;

wherein the substrate defines a plurality of plated through holes interconnected with the switch member via the circuit traces.

2. The electrical connector according to claim 1, wherein the over current protectors are vertically arranged.

3. The electrical connector according to claim 1, wherein the electrical subassembly further comprises a grounding plane sandwiched between the first and second magnetic modules and electrically connected with the third printed circuit boards.

4. The electrical connector according to claim 1, wherein the electrical connector further comprises a flexible circuit shield being assembled to bottom surface of the housing for substrate and protecting the main printed circuit board.

5. The electrical connector according to claim 1, wherein the electrical connector further comprises a shield enclosing the insulative housing and adapted for being grounded to the main printed circuit board.

6. The electrical connector according to claim 1, wherein first and second magnetic modules are arranged in a mirror-image manner and each includes a container, upper and lower pins disposed on upper and lower portions of the container, and a plurality of coils housed within the container and electrically connecting with the upper and lower pins.

7. The electrical connector according to claim 6, wherein some of upper and lower pins are electrically connected with the plated through holes of the substrate of the over current protector.

8. The electrical connector according to claim 1, wherein the rear face of the housing defines guiding passageways for guidably and releasably retaining the first and second printed circuit boards in position within the housing.

9. The electrical connector according to claim 8, wherein the housing further defines locating slots communicating with the guiding passageways, the locating slots offsetting in a vertical direction of the housing.

\* \* \* \* \*